United States Patent [19]

Pollachek

[11] Patent Number: 4,648,074
[45] Date of Patent: Mar. 3, 1987

[54] REFERENCE CIRCUIT WITH SEMICONDUCTOR MEMORY ARRAY

[75] Inventor: Robert G. Pollachek, Bridgewater Township, Somerset County, N.J.

[73] Assignee: RCA Corporation, Princeton, N.J.

[21] Appl. No.: 625,910

[22] Filed: Jun. 29, 1984

[51] Int. Cl.[4] ............................................. G11C 11/40
[52] U.S. Cl. .................................... 365/184; 365/110
[58] Field of Search ........................ 365/184, 208, 210

[56] References Cited

U.S. PATENT DOCUMENTS

4,449,203  5/1984  Adlhoch ............................. 365/210

Primary Examiner—James W. Moffitt
Attorney, Agent, or Firm—Joseph S. Tripoli; Henry I. Schanzer

[57] ABSTRACT

A reference circuit which is particularly useful in combination with a memory array in which data transistors are arranged in rows and columns and in which the conduction paths of the data transistors along each column are connected in series between a common ground line and a bit line forming a stack. A problem exists in that the signal current flowing in a stack varies as a function of the position of a selected data transistor along the stack and of the information stored in the other data transistors of the stack. The reference circuit includes means for generating a different reference current corresponding to each row of data transistors along the stacks, where each reference current mirrors and tracks a particular signal condition of the data transistors being sensed in its corresponding row.

9 Claims, 8 Drawing Figures

REFERENCE CIRCUIT WITH SEMICONDUCTOR MEMORY ARRAY

This invention relates to means for generating reference signals which track certain signals to be sensed.

A problem exists in sensing signals produced by high density memory arrays where the signals are low amplitude currents which have to be sensed very quickly. For example, a signal current of 15 microamperes generated by a "selected" memory cell results in a signal voltage change of 375 millivolts when charging (or discharging) a 2 picofarad capacitor for a period of 50 nanoseconds. Such a small amplitude signal is difficult to sense reliably particularly where the signal current is pattern sensitive, varying considerably as a function of where and how the data being read is stored in the memory array. Furthermore, the amplitude of the signal current may vary considerably as a function of processing variations, changes in temperature and power supply variations. Accordingly, a significant problem exists in trying to quickly sense the value of the signal current.

The nature of the problem may be illustrated by reference to FIG. 1 which shows three NAND-stacks (S1, S2, S3) of series connected insulated-gate field-effect transistors (IGFETs) forming the storage cells of a read only memory (ROM) array. Each stack (Si) includes eight data IGFETs (Mi1, Mi2, ... Mi8) of N-conductivity type having their conduction paths connected in series with the conduction path of a stack select transistor (Ti) between a bit line and a common ground line. The data ("memory") transistors are identified by the letter M followed by two reference numerals (i, j); the first numeral, i, refers to the number of the stack and the second number, j, to the order (rank, or row) of the transistor along the stack. The data transistors in each stack are numbered in order from 1 to 8 with the lower numbered transistor (Mi1) being closest to the bit line and the highest numbered transistor (Mi8) being farthest from the bit line. The gate electrodes of the data transistors (Mij) of the same rank (or row) are connected to a common word line or row conductor (Wj), whereby, for example, the gate electrodes of the Mi1 data transistors of each stack are connected to W1, the gate electrodes of the Mi2 data transistors of each stack are connected to W2, etc.

Typically, the data transistors (Mij) as well as the stack select transistors (Ti) are formed of one conductivity type (e.g. N-conductivity type) and initially all are made to be of the enhancement mode. Information (data) is programmed (written) into selected data transistors by altering their threshold voltage. Typically, this can be done by using ion implantation to turn (or program) selected transistors into depletion mode transistors (hereinafter also referred to as "depleted" transistors). The depleted transistors are illustrated in the appended drawing by a darkening of their conduction channel between the source and drain regions. Depletion-mode transistors can conduct even with zero gate-to-source potential while an enhancement-mode IGFET (hereafter also referred to as an "enhanced" transistor) can only conduct when its applied gate-to-source potential ($V_{GS}$) is greater than its threshold voltage ($V_T$) in a direction to turn-it-on.

The information stored in a selected data transistor (Mij) is sensed by turning-on its associated stack select transistor (e.g. Ti), and precharging the bit line to $V_{DD}$ volts by momentarily turning on precharge transistor, PT. The word line (e.g. Wj) of the selected data transistor (e.g. Mij) is grounded, whereby its $V_{GS}$ is zero volts. All the other word lines are driven to $V_{DD}$ volts, in order to turn-on all the "non-selected" transistors in series with the selected transistor. The selected transistor (e.g. Mij) conducts if it is depleted and is turned-off and non-conducting if it is enhanced.

If Mij is enhanced—assume this condition represents the storing of a logic "0"—no signal current ($I_S$) will flow. Actually, some small leakage current may be present, but this leakage current is negligible and the $I_S$ for the storing of a logic "0" may be reasonably assumed to be zero. Thus, in general, if a data transistor being sensed is enhanced, it does not conduct (when its $V_{GS}$ is zero volts) and there is no conduction (except for leakage) via its series path and its associated stack transistors between the bit line and ground.

If Mij is depleted—assume this condition to represent the storing of a logic "1"—a signal current ($I_S$) flows from the bit line and via the conduction paths of the series connected transistors in its associated stack to ground. The signal current then discharges the bit line towards ground potential. However, the amplitude of the signal current ($I_S$) produced when a data transistor is depleted (storing a logic "1") varies as a function of its position along the stack and as a function of how the other data transistors of the stack are programmed. The variations in signal current result from different source-to-substrate reverse bias (i.e. the "body" effect) conditions, and different gate-to-source bias voltages ($V_{GS}$) developed across each data transistor along the stack. These different bias voltages cause different drain-to-source voltage ($V_{DS}$) drops across each transistor and cause the channel conductivity and the resultant signal current of each transistor to vary as a function of its relative position along its stack.

Figure 2A:
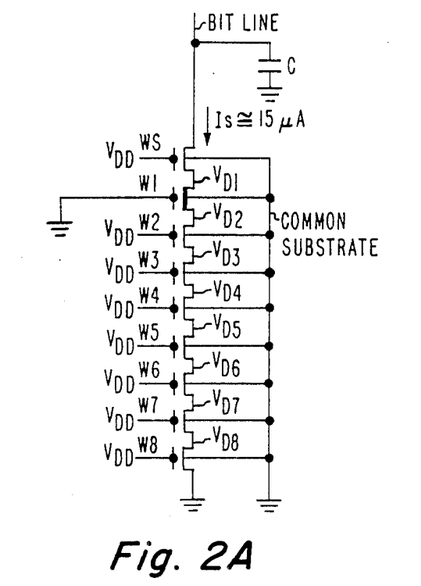
FIGS. 2A, 2B, 2C and 2D illustrate different conditions producing different signal currents.
Figure 2B:
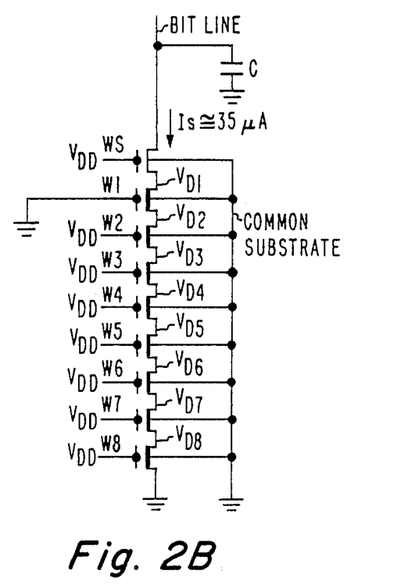
Figure 2C:
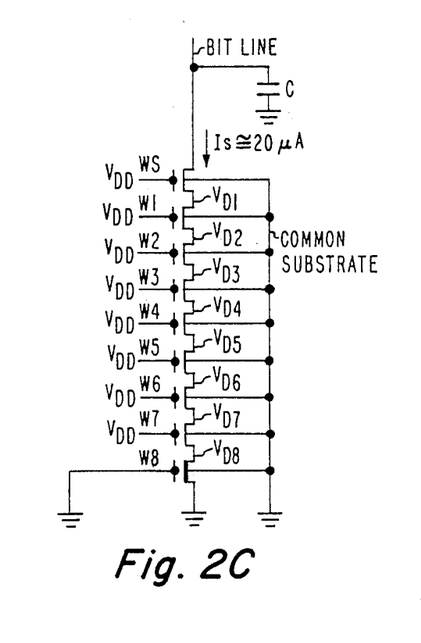
Figure 2D:
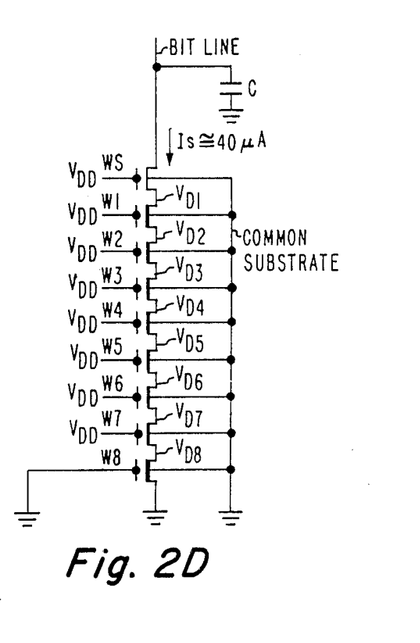

For example, as shown in FIGS. 2A and 2B if the first data transistor (e.g. Mi1) of a stack is depleted and selected, the resultant signal current may range, for example, from 15 microamperes to 35 microamperes depending on whether the remaining data transistors are all enhanced or all depleted. On the other hand, if as shown in FIGS. 2C and 2D the eighth data transistor (e.g. Mi8) of a stack is depleted and selected the signal current may range, for example, between 20 microamperes and 40 microamperes depending on whether the remaining data transistors are all enhanced or all depleted. Thus, the signal current for a stored logic "1" condition varies over a wide range.

Figure 1:
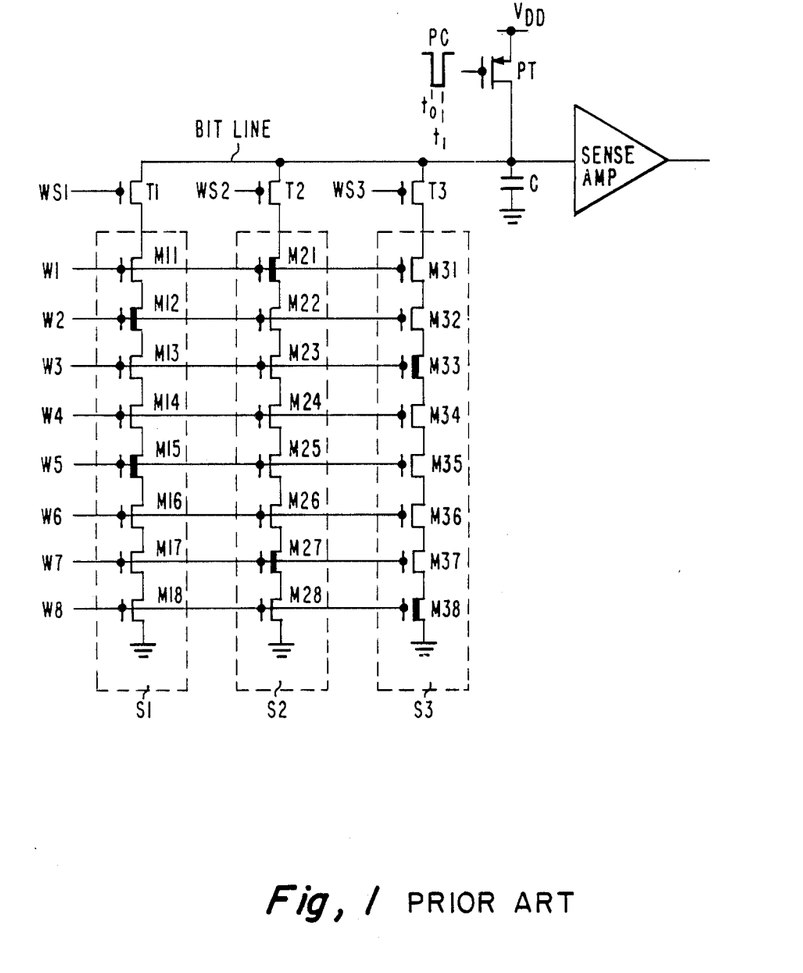
FIG. 1 is a schematic diagram of a prior art memory array.

For the configuration of FIG. 1 in which the transistors are of N-conductivity type, the signal current discharges the initially charged (to $V_{DD}$ volts) bit line capacitance towards ground potential. However, the rate of discharge is relatively slow for long, heavily loaded bit lines or long stack lengths. Where the value of the data must be determined very quickly (e.g. within 50 to 100 nanoseconds of a read command) a very serious problem exists because of the small and widely varying amplitude of the signal voltage developed during the relatively brief "sense period". These variations make it difficult to set a fixed reference voltage or current about which the sensed signal can be reliably compared to determine whether a logic "1" or a logic "0" was read.

The gravity of the problem is even more evident when it is recognized that if the turn-on voltage applied to the gates of the "non-selected" series connected data transistors is a little low or a little high—an event which is very likely in high density arrays—even wider differences in the signal current will result. The problem is further compounded by numerous other factors which affect the amplitude of the signal current. Some of these factors include changes in temperature, variations in processing which affect the impedance (conductivity) of the transistors, and variations in power supply voltage.

Sensing the output of a memory stack and trying to assess its value by comparing it to an arbitrarily fixed reference voltage (or current) level is difficult because the reference voltage level must track between the minimum data logic '1' level and maximum data logic '0' level throughout all parametric and supply voltage excursions. For maximum noise immunity, the reference level must lie as closely as possible midway between the above levels. This "midway" point varies depending on numerous transistor parameters and on the positions and quantity of programmed and non-programmed transistors in any given stack. Since the signal variations are large, setting up a fixed arbitrary reference voltage level gives highly unsatisfactory results. Therefore, a serious problem exists regarding the establishment of a useful reference level.

The problem is resolved in circuits embodying the invention by means of a reference circuit which generates a reference current ($I_R$) which mirrors the worst case logic "1" signal current condition for each data transistor being sensed. The reference current so generated may then be compared to the signal current and the difference amplified.

In the accompanying drawing, like reference characters denote like components.

Figure 3:
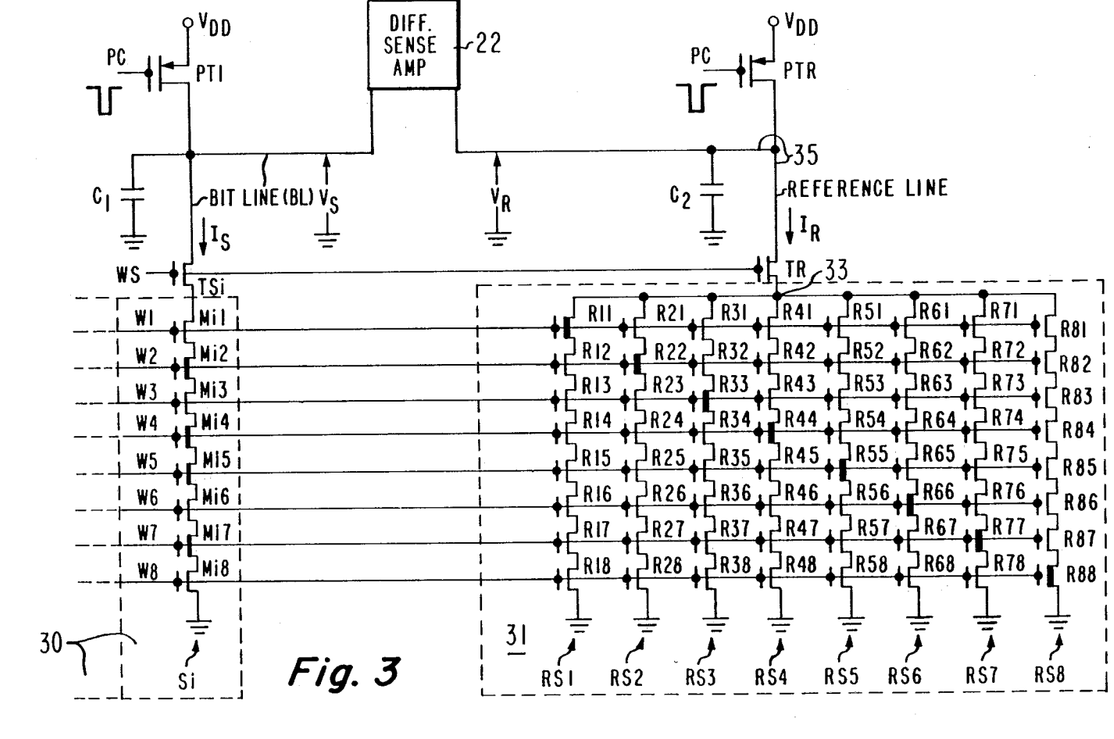
FIG. 3 is a schematic diagram of a memory array including a reference circuit embodying the invention.

The circuit of FIG. 3 shows one stack (Si) of a multiplicity of memory stacks forming the data storage portion of a memory array 30. Stack Si is similar to stacks S1, S2 and S3 shown in FIG. 1 and need not be greatly detailed. Suffice it to say that stack Si includes eight (8) rows of data transistors whose conduction paths are connected in series with each other and with the conduction path of a stack select transistor (Tsi) between bit line (BL) and a common ground line. When Tsi is turned-on a signal current $I_S$, whose amplitude is a function of the impedance (conductivity) of the data (memory) transistors, as discussed above, flows between the bit line and ground. The bit line is connected to one input of a differential amplifier 22. The capacitance associated with the bit line is represented by capacitor C1 which is connected between the bit line and ground. A precharge transistor, PT1, has its conduction path connected between the bit line and $V_{DD}$ which is, for example, +5 volts. Prior to reading the contents of a memory stack, its associated bit line is precharged to $V_{DD}$ volts by applying a precharge pulse (PC) to the gate electrode of PT1 which turns PT1 on momentarily.

The circuit of FIG. 3 also includes a reference circuit 31 comprised of eight strings (RS1, RS2, . . . RS8) of reference transistors. Each string corresponds to a different one of the eight rows of data transistors Mi2, Mi3, . . . Mi8) in stack(s) Si and is identified by the letters RS followed by a numeral which corresponds to the row of its associated data transistors. For example, reference string RS1 corresponds to row 1 and is selected to produce a reference current when a transistor in row 1, such as Mi1, is selected to be sensed. Similarly, reference string RS2 corresponds to row 2 and is selected to produce a reference current when a transistor in row 2, such as Mi2, is selected to be sensed. In general, reference string RS2 corresponds to the row of data transistors Mij and is selected to produce a reference current when a data transistor (i.e. Mij) along row j is selected to be sensed. Thus, there is one string of reference transistors for each row of data transistors in memory stack(s) Si. Furthermore, each string of reference transistors includes eight transistors, one transistor for each row of transistors in memory stack(s) Si, and the eight transistors of each string have their conduction paths connected in series between a node 33 and a common ground line.

Since there is one string (column) of reference transistors per row of data transistor and since the number (e.g. 8) of rows of reference transistors equals the number (e.g. 8) of rows of data transistors, the reference transistors form a square matrix. The elements of the matrix are denoted by the letter R followed by two numerals (j, i). The first numeral, j, refers to the order of the column (or string) and indicates that it corresponds to the Mij data transistor. The second numeral, i, refers to the order of the row or position of the transistor along the series string with the lowest number being assigned to the transistor closest to the bit line and the highest number being assigned to the transistor farthest from the bit line (i.e. closest to ground line). For the order and sequence of reference elements shown in matrix 31 of FIG. 3 only those Rji elements whose column (string) and row (rank) are the same (i.e. i=j) are made depletion mode transistors. This defines the presence of only one depletion transistor along any one column and along any one row, with the depletion transistors lying along the diagonal of the matrix formed by the reference transistors.

The data transistors in memory array 30 and the reference transistors in circuit 31 are assumed to be of the same N-conductivity type.

The gate electrodes of the reference transistors Rij of a row (e.g. R11, R21, . . . R81) and the gate electrode of the data transistors (e.g. Mi1) of that row are connected to the same row conductor (word line—Wi). This connection provides the following: Firstly, since only one reference transistor (i.e. Rji, where i=j) is depleted along any row, only that depleted transistor will conduct when the corresponding data transistor Mij is "selected" and its corresponding row conductor is held at a potential (i.e. ground) sufficient to render the enhancement transistors non-conducting while allowing the depletion transistors to conduct. Secondly, the "selected" depleted reference transistor has the same position or rank along its series string as the corresponding data transistor selected to be sensed has along its series stack. As detailed below this enables the reference string to produce a reference current which mirrors the lowest amplitude logic "1" signal current that would normally flow through the memory stack when the corresponding data transistor is selected.

The ends of the reference strings connected to node 33 are coupled via the conduction path of a single reference select transistor $T_R$ to reference line 35. Each of the reference strings could be connected via its own reference string select transistor to the reference line. However, it is more efficient to have a single reference select transistor as shown in FIG. 3. In the circuit of FIG. 3, the same number of transistors are connected between the bit line and ground via a selected memory stack as are connected between the reference line and ground via a conductive reference string. In FIG. 3 the same control signal WS is applied to the gate electrodes of TSi and $T_R$. This ensures that the reference circuit is coupled to reference line 35 whenever the memory stack Si is to be read, and that the conductivity of $T_R$ mirrors that of TSi.

The reference line 35 is connected to a second input of differential amplifier 22. The capacitance associated with reference line 35 is represented by a capacitor C2 connected between the reference line and ground. In this embodiment, C2 is made to have twice the value of C1. However, as discussed below, this is not necessary to practice the invention, and C2 may be made a different ratio of C1.

The reference line may be selectively precharged to $V_{DD}$ volts via P-conductivity type precharge transistor, PTR, whose conduction path is connected between the reference line and $V_{DD}$ and to whose gate electrode is selectively applied a precharge pulse (PC) for turning-it-on momentarily.

The signal current ($I_S$) flowing in the bit line and the reference current flowing in the reference line are applied to the differential inputs of amplifier 22. When IS is equal to or greater than $I_R$ the bit line gets discharged faster than the reference line. Consequently the voltage ($V_S$) on the bit line is then less positive than the voltage ($V_R$) on the reference line and the differential amplifier output indicates the storage of a logic "1". When $I_S$ is less than $I_R$, $V_S$ is more positive than $V_R$ and the differential amplifier indicates the storage of a logic "0".

In the discussion of the operation of FIG. 3 to follow, since the memory stack and reference circuit transistors are assumed to be of N-conductivity type, the enhancement transistors are turned-off (i.e. non-conductive) when zero volts is applied to their gate electrodes—since this applies a $V_{GS}$ which is less than their threshold voltage ($V_T$), and are turned-on when $V_{DD}$ volts is applied to their gate electrodes—since this applies $V_{GS}$ greater than $V_T$ volts. The depletion transistors are turned-on (i.e. can conduct) even when zero volts is applied between their gate and source electrodes, and of course, their conductivity increases when their gate electrodes are driven positive with respect to their source electrodes.

When a selected data transistor (Mij) is to be sensed, the bit and reference lines are precharged to $V_{DD}$ volts by momentarily turning-on transistors PT1 and PTR. The stack select transistor, TSi, and the reference circuit select transistor, $T_R$, are then turned-on. In general, when any data transistor Mij is selected to be sensed its corresponding word line Wj is held at ground potential while the remaining word lines are held at $V_{DD}$ volts. Consequently, in reference circuit 31 only one reference transistor, Rij, where i=j, can conduct, and only one reference string, RSj, is rendered conductive at any one time during sensing.

When Mij is selected and row j is grounded applying $V_{DD}$ volts to the remaining rows (word lines) unconditionally turns-on the "non-selected" remaining transistors in the stack. If Mij is enhanced,—a condition which is arbitrarily defined herein as a logic "0" signal condition—the corresponding $I_S$ is assumed to be zero. On the other hand, if Mij is depleted—which condition is arbitrarily defined herein as a logic "1" signal condition—a signal current flows. However, the lowest amplitude logic "1" level signal current flows when the selected data transistor of a stack is depleted and all the remaining transistors in the stack are enhanced. This condition is simulated in reference circuit 31 for each row of data transistors.

Each reference string in circuit 31 includes a single depletion transistor and seven enhancement IGFETs. The impedance or conductivity of a "selected" reference string is thus a function of a depletion transistor whose gate is grounded, and seven turned-on enhancement IGFETs. Furthermore, the position of the depletion transistor (Rji, where i=j,) along the "selected" reference string RSj is identical to the position (row or rank) of the corresponding data transistor being sensed along its memory stack. Thus, when Mi1 is to be sensed, string RS1 is selected which includes R11 in the same row as Mi1; when Mi2 is to be sensed string RS2 is selected and includes R22 in the same row as Mi2; when Mi3 is to be sensed string RS3 is selected and includes R33 in the same row as Mi3, etc. In normal operation, the impedance in series with the drain and source of R11 equals the highest impedance that will be seen in series with the drain and source of Mi1. Similarly, the impedance in the drain and source circuits of R22 equals the highest impedance that will be seen in the drain and source circuits of Mi2; and likewise for the remaining reference strings.

For example, when Mi1 is to be sensed row conductor W1 is grounded and $V_{DD}$ volts is applied to W2 through W8. Transistors Mi2 through Mi8 are therefore unconditionally turned-on while Mi1 will conduct only if it is depleted—i.e. storing a logic "1". With respect to reference circuit 31, although row conductor W1 is grounded, transistor R11 can conduct since it is a depletion transistor. However, the other transistors (R21–R81) in row 1 are enhanced and are turned-off (non-conductive). Thus current conduction can only take place in the first string RS1. There is no current conduction in the remaining strings of the reference circuit.

When Mi1 in the first row of the memory stack is selected to be read out the lowest amplitude logic "1" level signal current ($I_{S1}$) flows for the condition of Mi1 being depleted and the remaining data transistors of the stack Si being enhanced. The reference current ($I_{R1}$) produced in string RS1 equals this "lowest amplitude" signal current when string RS1 in reference circuit 31 is conducting since R11 is a depletion transistor in series with seven enhancement transistors and the gate electrodes of the reference transistors are driven by the same voltages as the corresponding data transistors. Thus $I_{R1}$ equals the lowest amplitude logic "1" signal current ($I_{S1}$) that can flow in memory stack Si when data transistor Mi1 is selected. Clearly, the lowest logic "1" level signal current that can flow when the first rank data transistor (Mi1) is sensed is correctly and accurately mirrored by the reference current through string RS1.

In a like manner, string RS2 produces a reference current ($I_{R2}$) when element Mi2 is selected to be sensed. The reference current produced by RS2 corresponds to, and mirrors, the lowest logic "1" level signal current that can flow when Mi2 is selected. Mi2 is selected for read-out by applying ground potential to W2 and $V_{DD}$ volts to all the other word lines (also to WS to turn on TSi and TR).

Applying zero volts to line W2 turns-off all the reference transistors in the second row of reference circuit 31 except for depletion transistor R22 which is on and conducting. Therefore, there can only be conduction in reference string RS2. Applying $V_{DD}$ volts to all the other word lines unconditionally turns-on all the reference transistors in series with R22. The drain of Mi2 is connected to the source of Mi1 while the source of Mi2 is connected via the conduction paths of transistors Mi3 through Mi8 to ground. If Mi2 is enhanced, no current flows when W2 is at ground potential. If Mi2 is depleted a signal current flows whose amplitude is a function of the position of Mi2 along the series conduction path. The lowest amplitude signal current which flows when Mi2 is selected occurs when Mi2 is depleted and the remaining transistors in the stack are enhanced. This condition is obviously mirrored by string RS2 with R22 located in the same position along the string as Mi2 along the stack.

Evidently, for each row of data transistors there is a corresponding reference string which produces a reference current which equals the lowest amplitude logic "1" level signal current that will flow through the memory stack when any data transistor of that row is sensed.

In the discussion above, it was assumed that the non-selected word lines (e.g. W2 through W8 when Mi1 is selected) are held at $V_{DD}$ volts. However, as also discussed above, in large arrays the actual voltage applied to some of the word lines may be other than the $V_{DD}$ volts intended to be applied, due to any number of processing or circuit variations. A significant advantage of the reference circuit of the invention is that the word line potentials applied to the row conductors of the data transistors are likewise applied to the row conductors of the reference transistors. Thus, for example, if the potential applied to the gate electrode of data transistor Mi1 is less than $V_{DD}$ volts whereby the conductivity of the stack is decreased, a like potential is applied to the gate electrode of reference transistor R11 whereby the conductivity of the reference string RS1 is decreased in a similar manner to that of the stack containing the data transistor being sensed. This feature applies to every data transistor being sensed and to the production of a corresponding reference current which in all instances will normally mirror the lowest logic "1" level signal current being produced.

As a result, corresponding to each selected data transistor in a memory stack, the reference circuit produces a reference current ($I_R$) which is equal to, or mirrors, the lowest amplitude logic "1" level signal current that will normally flow in the memory stack when the "selected" data transistor is depleted.

Forming the reference strings of transistors on the same IC as the memory stack transistors, driving the gates of the reference transistors with the same or similar voltages as the memory transistors, and applying similar precharge voltages to the bit and reference lines ensures that the smallest value of $I_R$ in each string will indeed be very similar to the smallest logic "1" signal current that flows through the memory stack Si. This also ensures that the reference and signal currents track for all normal variations of transistor characteristics and dimensions, as well as all operating conditions.

As demonstrated above, the reference current generated by means of the reference circuit 31 is an extremely reliable reference signal against which the data signal may be compared to produce a reliable indication of the value of the data stored. Thus as shown in FIG. 3, the signal and reference currents are applied to differential amplifier 22 to produce an output indicative of whether the signal current is greater or less than than the reference current, and hence of the value of the stored signal. Since the reference is highly accurate even small differences between the reference signal and the data signal may be safely amplified to produce a reliable indication of the value of the data stored.

For the condition where the memory stack Si includes data information identical to that in the corresponding reference string the signal current ($I_S$) would be approximately equal, if not exactly equal, to the $I_R$ current generated by the reference circuit. To ensure that a differential signal is always generated, the capacitance C2 associated with reference line 35 is made to have twice the capacitive value of C1. Accordingly, the signal voltage ($\Delta V_S$) will be greater than the reference voltage ($\Delta V_R$) whenever a logic "1" condition is stored in a memory transistor being sensed.

Instead of making C2 twice the size of C1 the reference current could be cut in half by means of a current splitter. Where the reference transistor can be made smaller than the memory transistor, the reference current could be made a portion of the signal current by reducing the size of the reference transistors relative to the memory transistors. However in many applications the memory transistors are made as small as possible to make the highest density memory possible. Ergo, different circuit techniques may be used to generate a differential signal.

Figure 4:
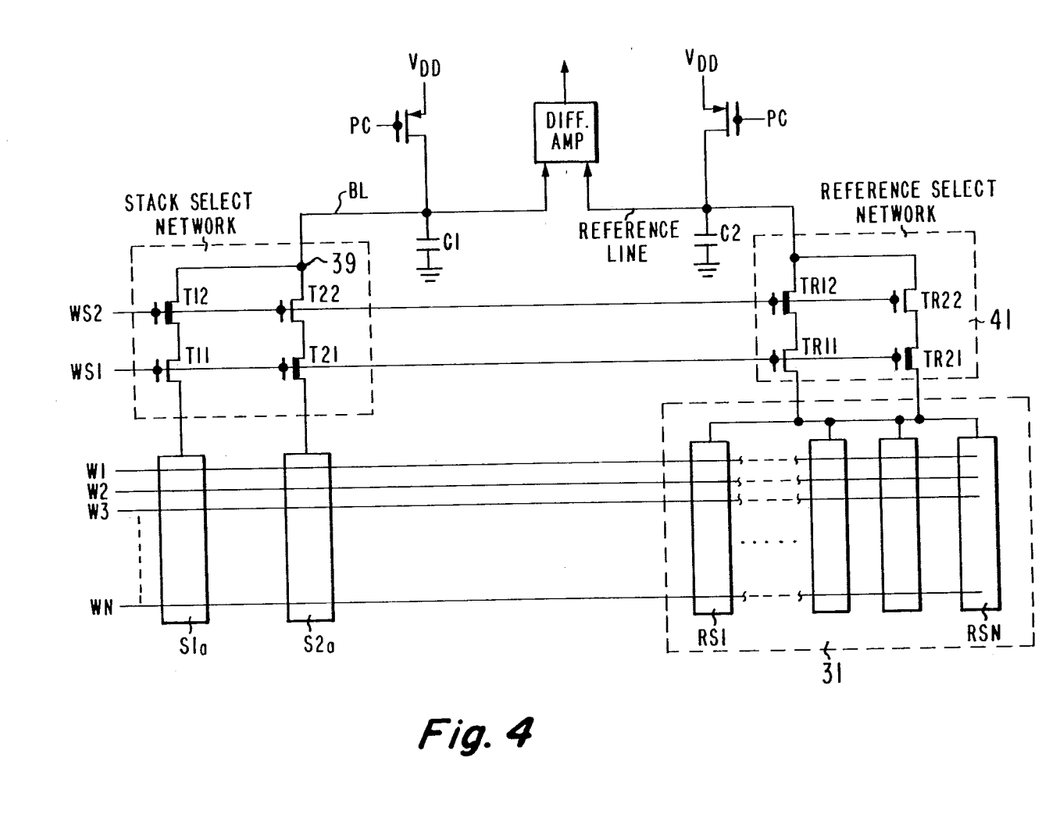
FIGS. 4 and 5 are diagrams of different memory array arrangements embodying the invention.

The arrangement shown in FIG. 4 demonstrates a means for connecting the reference matrix in combination with a stack-type memory in which every two stacks (e.g. S1, S2) are laid out next to each other so that they share a single bit line contact 39 between them. This allows a smaller (higher density) memory array to be built by reducing the number of bit lines and bit line contacts by a factor of two. However, selecting each stack now requires that two stack-select control lines (WS1, WS2) intersect each stack. One control line (e.g. WS1) is required to connect/disconnect the left stack (e.g. Sl) from the shared bit line contact 39, and the other control line (WS2) is required to connect/disconnect the other stack (S2) from the bit line contact. In silicon-gate technology, wherever any polysilicon line (e.g. WS1 or WS2) crosses a stack line, an undesired extra transistor (i.e. T12, T21) is formed which initially, for example, would be of the enhancement mode. To provide a conduction path for stack S1a (or S2a) when stack S2a (or S1a) is de-selected and WS2 (or WS1) is held at ground potential the extra transistors (i.e. T12, T21) are programmed to the depletion mode, whereby they conduct when their gate electrode is grounded. To mirror the connection of the memory stacks to the bit line, a reference select network 41 of four transistors is formed between each reference matrix 31 and the reference bit line. Transistors TR11 and TR12, corresponding to T11 and T12, respectively, form one path between the reference line and reference circuit 31 and transistors TR21 and TR22, corresponding to T21 and T22, respectively, form a second path. TR12 and TR21 are depletion mode transistors whereby they can conduct even when their gates are grounded. Reference matrix 31 is thus coupled to the reference line via transistors TR11 and TR12 when WS1 is high and WS2 is low and via TR21 and TR22 when WS1 is low and WS2 is high. The modulation of the stack signal currents produced by elements T11, T12, T21, T22 and WS1 and WS2 is thereby mirrored by network 41 coupled to the reference circuit 31.

Figure 5:
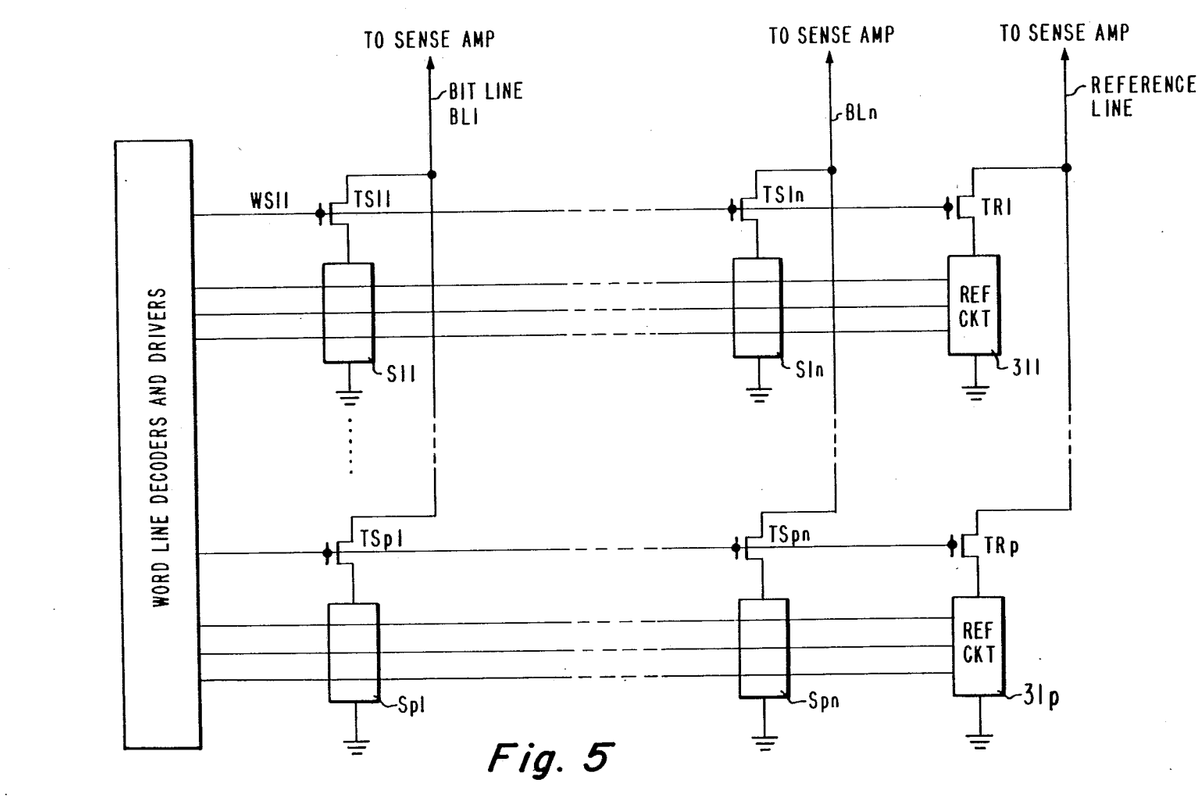

The circuit of FIG. 5 shows the sharing of bit lines and the reference line by different sets of memory stacks and reference circuits. Typically, the reference circuits 31 are placed farthest from the word line drivers 51 whereby the potentials applied to the gate electrodes of the reference transistors have to propagate the longest distance along the row conductors and hence tend to be "weaker" than those applied to the intervening data transistors in the memory stacks. In a large memory array fabricated on an IC, to generate a reference current which is always equal to, or less than, the lowest logic "1" signal level condition, the location of the reference circuit must be "layed-out" carefully relative to the memory stacks. Thus, the reference circuits 31 are normally placed at the "end" of the row conductor, the "end" being the farthest point from the decoder/-drivers 51.

In the circuit of the invention the data signal and the reference signal currents were supplied to different inputs of a differential amplifier. However, it should be evident that other comparator schemes, e.g. current mirrors, may be used for reflecting the reference and signals currents and subtracting one from the other to produce a net current indicative of the value of the information being stored.

The invention has been illustrated assuming that the array was initially comprised of enhanced IGFETs, and that subsequently selected IGFETs were "programmed" to become depletion mode IGFETs. It should be evident that, instead, the array could initially be formed using depletion mode transistors and selected transistors would subsequently be programmed to become enhancement mode IGFETs.

It should also be evident that the invention could be practiced using only depletion transistors or only enhancement transistors which could be programmed to have two different threshold voltages. For example, depletion transistors could be made to have a threshold of −6 volts representing the storage of a logic "1" and a threshold of −3 volts representing the storage of a logic "0". For that example, when the word lines would be driven to −3 volts the transistors whose threshold voltage would be −3 volts would be turned-off and only those whose threshold voltage would be set or programmed to −6 volts would conduct. The operation would therefore be very similar to that described above except that the word line voltages to turn the transistors on or off would have to be tailored to account for the different threshold voltage conditions. Similarly, where all the transistors were made of the enhancement type, the threshold voltages could be tailored to be for example +2 volts representing the storage of a logic "1" and +4 volts representative of a logic "0". In such an instance, the word line voltages would have to be driven to a minimum of 2 volts to render the transistors with a $V_T$ of 2 volts conducting and the word lines would have to be driven more positive than +4 volts to cause those transistors with a $V_T$ of +4 volts to conduct.

In the discussion above, it was assumed that the data and reference transistors were of N-conductivity type. It should be evident that P-conductivity type transistors could be used instead, with appropriate care for the polarity of the operating potential.

What is claimed is:

1. In a memory array which includes a multiplicity of data transistors arranged in M rows and X columns where M is an integer greater than one; each data transistor having a conduction path and a control electrode for controlling the conductivity of its conduction path; and including means connecting the conduction paths of the M data transistors in each column, one data transistor being from each row, in series between a point of reference potential and a bit line, each group of M series connected data transistors defining a stack; and in which there is a row conductor per row connected to the control electrodes of the data transistors of that row; and in which said data transistors are either set to a first threshold value (VT1) corresponding to the storing of a logic "0", or to a second threshold value (VT2) corresponding to the storing of a logic "1"; and wherein the information stored in a selected data transistor of a stack is sensed by applying to its control electrode a first voltage V1 for which it is non-conducting if it is storing a logic "0" and for which it is conducting if it is storing a logic "1", and by concurrently applying a second voltage (V2) to the control electrodes of the remaining data transistors of that stack for rendering them unconditionally conducting; and wherein the signal current flowing in a stack varies as a function of the position of the selected transistor along the stack and of the information being stored in the other transistors of that stack, the improvement comprising:

means for generating a different reference current corresponding to each row of data transistors with the amplitude of each different reference current being a function of the physical position of its corresponding row along the series stack.

2. In the memory array as claimed in claim 1, wherein each reference current has a value approximately equal to the current flowing through its corresponding data transistor when the threshold voltage of said data transistor is set at said second threshold value (VT2) and said first voltage (V1) is applied to its control electrode and the threshold voltages of the remaining data transistors in the same stack as the selected data transistor are set at said first threshold value (VT1) and said second voltage is applied to their control electrodes.

3. In the memory array as claimed in claim 2, wherein said means for generating different reference currents includes a string of M reference transistors per row of data transistors, whereby each string has the same number of transistors as each stack, and wherein each one of the M reference transistors has a conduction path and a control electrode for controlling the conductivity of its conduction path; and further including means for coupling each string of reference transistors between said point of reference potential and a reference line.

4. In the memory array as claimed in claim 2 wherein each string of M transistors has only one transistor set to $V_{T2}$ the remaining transistors of the string being set to $V_{T1}$; and wherein the one transistor set to $V_{T2}$ is positioned along its string in the same order as its corresponding row of data transistors with respect to the length of the stacks.

5. A memory array comprising:

a multiplicity of data transistors arranged in M rows and X columns; where M is an integer greater than 1, each data transistor having a conduction path and a control electrode for controlling the conductivity of its conduction path;

means connecting the conduction paths of the M data transistors in each column, one data transistor being from each row, in series between a point of reference potential and a bit line; each group of M series connected data transistors defining a stack;

a row conductor per row connected to the control electrodes of the data transistors of that row;

said data transistors storing information by having their threshold voltages set to either a first value (VT1) corresponding to the storing of a logic "0", or to a second value (VT2) corresponding to the storing of a logic "1"; and wherein the information stored in a selected data transistor of a stack is sensed by applying to its control electrode a first voltage V1 for which it is non-conducting if it is storing a logic "0" and for which it is conducting if it is storing a logic "1", and by concurrently applying a second voltage (V2) to the control electrodes of the remaining data transistors of that stack for rendering them unconditionally conducting; and wherein the signal current flowing in a stack varies as a function of the position of the selected transistor along the stack and of the information being stored in the other transistors of that stack;

a reference circuit for producing a different reference current per row of data transistors comprising:

an array of M by M reference transistors (Rij) arranged in M rows and M columns, one row of reference transistors for each row of data transistors, and each column of reference transistors corresponding to a row of data transistors; each reference transistor having a conduction path and a control electrode for controlling the conductivity of its conduction path; each reference transistor being identifiable by the letter R followed by two numerals (i, j) the first numeral identifying its row position and the second numeral its column position;

means connecting the control electrodes of the M reference transistors of each row to the row conductor of a corresponding row of data transistors;

means connecting the conduction paths of the M reference transistors of each column between said point of reference potential and a reference line; and said reference circuit being characterized in that only those reference transistors Rij, where i is equal to j, have their threshold voltages set to said second value, (VT2), all other reference transistors having their threshold voltages set to said first value (VT1).

6. The memory as claimed in claim 5 wherein said reference transistors and said data transistors are of the same conductivity type.

7. The memory as claimed in claim 6 wherein said transistors set to said first value are enhancement mode insulated-gate field-effect transistors (IGFETs) and wherein said transistors set to said second value are depletion mode IGFETs.

8. The combination as claimed in claim 5 further including means coupled to said bit and reference lines for comparing the signals produced on said lines.

9. A memory array comprising:

a multiplicity of data transistors arranged in M rows and X columns;

an array of M by M reference transistors (Rij) arranged in M rows and M columns, each row of reference transistors corresponding to a row of data transistors, and each column of reference transistors also corresponding to a row of data transistors; each reference transistor being identifiable by the letter R followed by two numerals (i, j) the first numeral identifying its row position and the second numeral its column position; each transistor having a conduction path and a control electrode for controlling the conductivity of its conduction path; and said transistors storing information by having their threshold voltages set to either a first value (VT1) corresponding to the storing of a logic "0", or to a second value (VT2) corresponding to the storing of a logic "1";

a bit line and a reference line;

means connecting the conduction paths of the M data transistors in each column, one data transistor being from each row, in series between a point of reference potential and said bit line; each group of M series connected data transistors being termed a stack;

a row conductor per row connected to the control electrodes of the data transistors of that row and to the control electrode of the reference transistors of the corresponding row;

means for selectively sensing the information stored in a selected data transistor of a selected stack including means for applying to the control electrode of the selected data transistor a first voltage V1 for which it is non-conducting if it is storing a logic "0" and for which it is conducting if it is storing a logic "1", and for concurrently applying a second voltage (V2) to the control electrodes of the remaining data transistors of that stack for rendering them unconditionally conducting;

means connecting the conduction paths of the M reference transistors of each column between said point of reference potential and said reference line; and said reference circuit being characterized in that only those reference transistors Rij, where i is equal to j, have their threshold voltages set to said second value, (VT2), all other reference transistors having their threshold voltages set to said first value (VT1).

* * * * *

UNITED STATES PATENT AND TRADEMARK OFFICE
CERTIFICATE OF CORRECTION

PATENT NO. : 4,648,074

DATED : Mar. 3, 1987

INVENTOR(S) : Robert G. Pollachek

It is certified that error appears in the above-identified patent and that said Letters Patent is hereby corrected as shown below:

Col. 4, line 10, change "RS2" to - - - RSj - - -.

Col. 8, line 37, change "cohtact" to - - - contact - - -.

Signed and Sealed this

Twenty-fourth Day of November, 1987

*Attest:*

DONALD J. QUIGG

*Attesting Officer*  *Commissioner of Patents and Trademarks*